US006036758A

United States Patent [19]

Fairweather

[11] Patent Number: 6,036,758

[45] Date of Patent: Mar. 14, 2000

[54] SURFACE TREATMENT OF COPPER

[75] Inventor: William A. Fairweather, Coventry, United Kingdom

[73] Assignee: PMD (U.K.) Limited, Coventry, United Kingdom

[21] Appl. No.: 09/131,532

[22] Filed: Aug. 10, 1998

[51] Int. Cl.$^{7}$ .......... C23F 11/00

[52] U.S. Cl. .......... 106/14.44; 106/14.13; 106/14.15; 106/14.41; 106/14.42; 106/14.43; 148/243; 148/269; 148/271

[58] Field of Search .......... 106/14.11, 14.13, 106/14.15, 14.41, 14.42, 14.43, 14.44; 148/243, 269, 271

[56] References Cited

U.S. PATENT DOCUMENTS

| | | | |
|---|---|---|---|
| 3,653,931 | 4/1972 | Borchert et al. | 106/3 |
| 3,933,531 | 1/1976 | Sawa et al. | 428/470 |
| 4,379,834 | 4/1983 | Herwig et al. | 430/329 |
| 4,957,653 | 9/1990 | Cordani | 16/106 |
| 5,017,267 | 5/1991 | Cordani | 216/95 |
| 5,173,130 | 12/1992 | Kinoshita et al. | 148/268 |
| 5,496,590 | 3/1996 | Maki et al. | 427/388.1 |
| 5,498,301 | 3/1996 | Hirao et al. | 148/269 |
| 5,795,409 | 8/1998 | Hirao et al. | 148/269 |

FOREIGN PATENT DOCUMENTS

| | | |
|---|---|---|
| 9619097 | 6/1996 | WIPO . |

*Primary Examiner*—Anthony Green
*Attorney, Agent, or Firm*—Oppenheimer Wolff & Donnelly LLP

[57] ABSTRACT

A composition useful for the surface treatment of copper, in particular for micro-roughening of the copper surface so as to improve the adhesion characteristics of the copper surface, comprises an oxidizing agent for copper and an aromatic sulfonic acid or a salt thereof. In a preferred embodiment, the oxidizing agent is hydrogen peroxide and the aromatic sulfonic acid is sodium m-nitrobenzenesulfonate. The composition preferably also includes an inorganic acid such as sulfuric acid and a corrosion inhibitor such as benzotriazole.

21 Claims, No Drawings

SURFACE TREATMENT OF COPPER

BACKGROUND OF THE INVENTION

This invention relates to a composition and method for the surface treatment of copper, and more particularly to a composition and method for improving the surface adhesion properties of copper foil. Using the method and composition of the invention the adhesion of subsequently applied coatings to the copper surface, as for instance during the manufacture of printed circuit boards, is improved.

In the manufacture of printed circuit boards (PCBs) it is generally necessary for a copper foil to be bonded to an insulating polymeric substrate. The copper foil is then imaged and etched to form the circuit layout. In the assembly of multilayer PCBs several such copper-substrate layers, referred to as "inner layers", are bonded together to form a laminate.

In such a manufacturing process it is essential that the layers making up the PCB laminate should bond effectively together. To this end, it is known for the copper surface to be treated with an adhesion promotion composition which roughens, on a microscopic scale, the smooth surface of the copper, thereby improving the adhesion characteristics of the copper surface for subsequently applied layers of the laminate.

U.S. Pat. No 5,037,482, for instance, discloses the use of cleaning and adhesion promotion compositions comprising an aqueous solution of an alkane sulfonic acid, a surfactant and an oxidising agent such as ferric nitrate.

In another approach, described in International Patent Application No WO96/19097, an adhesion promotion composition comprises an aqueous solution of hydrogen peroxide, an inorganic acid, a corrosion inhibitor and a surfactant, most preferably a cationic surfactant such as a quaternary ammonium compound.

Such prior art compositions offer some benefits, but suffer also from a number of disadvantages or potential disadvantages. In particular, the degree of adhesion which may be achieved may not be entirely satisfactory. In addition, the use of surfactants may be undesirable from the point of view of waste disposal. Also, the concentration of the organic components may be insufficient for them to be readily analysed. Such analysis may be desirable for process control purposes, to ensure that the correct concentrations are maintained during use.

SUMMARY OF THE INVENTION

An object of the invention is to provide a composition and method for the treatment of a copper surface so as to improve the adhesion characteristics of the copper surface and thereby to enable a subsequently applied coating to be more reliably adhered to the copper layer.

Another object of the invention is to provide a composition and method for the treatment of a copper surface so as to roughen the surface of the copper on a microscopic scale.

Still another object of the invention is to provide a composition and method for the treatment of a copper surface so as to roughen the surface of the copper and improve the adhesion characteristics of the copper surface with minimal environmental disposal problems for the waste products of the method.

Another object of the invention is to provide a composition and method for the treatment of a copper surface in which the concentrations of the organic components can be readily analysed, eg for process control purposes.

These and other objects of the invention are achieved, according to a first aspect of the invention, by a composition useful for the surface treatment of copper, said composition comprising an oxidising agent for copper and an aromatic sulfonic acid or a salt thereof.

According to a second aspect of the invention, a process for the treatment of a copper surface comprises applying to the surface a composition comprising an oxidising agent for copper and an aromatic sulfonic acid or a salt thereof.

In a preferred embodiment, the composition according to the invention comprises an aqueous solution of hydrogen peroxide, an inorganic acid such as sulfuric acid, a corrosion inhibitor such as benzotriazole and an aromatic sulfonic acid such as m-nitrobenzene sulfonic acid or a salt thereof, particularly the sodium salt thereof.

As described above, the invention is particularly useful in the manufacture of printed circuit boards. Thus, according to a third aspect of the invention there is provided a method for the manufacture of a printed circuit board, which method comprises forming an intermediate component of said printed circuit board, said intermediate component having a copper surface, subjecting said copper surface to a treatment in accordance with the second aspect of the invention, and subsequently applying a coating to the copper surface.

By an "intermediate component" is meant a laminated component which is assembled with other layers or components to form the finished PCB. Such an intermediate component may thus be a copper foil-clad inner layer. Examples of coatings which are subsequently applied to the copper surface are photoresists, oxide coatings and solder masks.

DETAILED DESCRIPTION OF THE INVENTION

The composition according to the invention is most preferably an aqueous solution of the various components.

The aromatic groups of the sulfonic acid or salt thereof are most preferably carbocyclic rings.

One particularly preferred group of aromatic sulfonic acids are benzene sulfonic acids. Another group of aromatic sulfonic acids are fused ring compounds such as naphthalene sulfonic acids.

The aromatic groups may optionally be substituted by one or more substituents, eg substituents selected from nitro, hydroxy, halogen, lower ($C_{1-6}$) alkyl, lower ($C_{1-6}$) alkoxy and other substituents.

The aromatic groups may carry one or more sulfonic acid groups.

Where the sulfonic acid is present as a salt, alkali metal salts are particularly preferred, especially the sodium salt.

The currently most preferred sulfonic acid for use in the composition of the invention is m-nitro benzene sulfonic acid, particularly in the form of its sodium salt. Other sulfonic acids which may be specifically mentioned include benzene-1,3-disulfonic acid and naphthalene-1,3,8-trisulfonic acid, again all most preferably in the form of alkali metal salts, in particular sodium salts.

The sulfonic acid is preferably present in the composition at a concentration of less than 5% w/v, eg from about 0.01% w/v to 5% w/v, more preferably 0.01 to 2% w/v, and particularly 0.01 to 1% w/v.

Whilst it may be possible to use any one of a variety of oxidising agents for copper in the composition and method of the invention, the most preferred oxidising agent is hydrogen peroxide. Other oxidising agents which may be suitable include ferric nitrate, ferric sulfate, sodium persulfate, etc.

The oxidising agent will generally be present in the composition at such a concentration as to produce a conversion of the copper surface from a substantially smooth surface to a substantially micro-roughened surface with increased adhesion characteristics for coatings subsequently applied to the copper surface. Particularly where the oxidising agent is hydrogen peroxide, the concentration of hydrogen peroxide present in the composition is preferably less than 5% w/v, more preferably in the range 0.5 to 3.5% w/v, and most preferably about 1.5 to 2.5% w/v.

The composition of the invention preferably also includes an inorganic acid. Any suitable inorganic acid may be utilised, the most preferred being sulfuric acid. Particularly where the inorganic acid is sulfuric acid, then the acid is preferably present in the composition at a concentration of between 2 and 20% w/v, more preferably between 2 and 15% w/v, and particularly between 5 and 10% w/v, eg about 7.5% w/v.

The composition preferably also includes a corrosion inhibitor. Amongst suitable corrosion inhibitors which may be used are those which are conventionally used for this purpose. Examples include triazoles, tetrazoles and imidazoles, and mixtures thereof. The currently most preferred corrosion inhibitor is benzotriazole. Particularly where benzotriazole is used as corrosion inhibitor, the concentration of the corrosion inhibitor in the composition is preferably in the range 0.1 to 2% w/v, more preferably less than 1% w/v and particularly less than 0.5% w/v, say about 0.4% w/v.

The composition according to the invention preferably contains no components other than water, the oxidising agent, an inorganic acid, the corrosion inhibitor and the sulfonic acid or salt thereof. In particular, it is found generally to be unnecessary to incorporate any surfactant in the composition.

The composition of the invention may be made up by mixing the components with water to form an aqueous solution. Where hydrogen peroxide is used as oxidising agent it will be added in the form of a diluted solution, eg a 28% solution.

The method of the invention may be carried out by dipping the copper surface in a quantity of the composition, eg within a bath. Alternatively, the compositions may be sprayed onto the copper surface. Prior to contact of the copper surface with the composition, the copper surface may be subjected to one or more pre-treatment steps, eg pretreatment with an acidic pre-cleaner.

Most preferably, the composition of the invention is maintained at constant temperature during contact with the copper surface. The temperature is most preferably a slightly elevated temperature, that is to say a temperature slightly above ambient temperatures. Most preferably, the temperature of the composition is less than 50° C., most preferably in the range 25° to 35° C., eg about 30° C.

The time period for which contact is maintained between the copper surface and the composition should be sufficient for a suitably roughened surface to be formed, but not so long that the copper surface is excessively etched away. In general, a contact time period of more than 30 seconds but less than 5 minutes is preferred, particularly 30 seconds to 2 minutes, and especially a contact period of the order of one minute or so.

| Example 1 | |
|---|---|
| Hydrogen peroxide | 2.8% w/v |
| Concentrated sulfuric acid | 7.5% w/v |
| Benzotriazole | 0.3% w/v |
| Sodium m-nitrobenzenesulfonate | 0.7% w/v |

A first solution containing the sulfuric acid, benzotriazole and sodium m-nitrobenzenesulfonate was made up and then mixed with a 28% hydrogen peroxide solution to give the solution with the above concentrations.

50 mm square copper-coated tested panels were put through the following process:

1. Acidic pre-cleaner (10%, 3 minutes, 40° C.)
2. Rinse
3. Conditioner (10%, 1 minute, 30° C.)
4. Rinse
5. Immerse in above formulation (1 minute, 30° C.) with agitation
6. Rinse The degree of etch (approximately 3 μm/min) and appearance of the plate (even dark brown colour) were indicative of the desired micro-roughening of the copper surface.

| | |
|---|---|
| Example 2 | |
| Hydrogen peroxide | 1.8% w/v |
| Concentrated sulfuric acid | 17.5% w/v |
| Benzotriazole | 0.3% w/v |
| Sodium m-nitrobenzenesulfonate | 0.6% w/v |
| Prepared and tested in the same manner as Example 1. | |
| Etch rate: 2.2 μm/min | |
| Appearance of plates: Brown | |
| Example 3 | |
| Hydrogen peroxide | 1.8% w/v |
| Concentrated sulfuric acid | 7.5% w/v |
| Benzotriazole | 0.25% w/v |
| Sodium m-nitrobenzenesulfonate | 0.1% w/v |
| Prepared and tested in the same manner as Example 1. | |
| Etch rate: 1.6 μm/min | |
| Appearance of plates: Brown | |
| Example 4 | |
| Hydrogen peroxide | 1.82% w/v |
| Concentrated sulfuric acid | 7.5% w/v |
| Benzotriazole | 0.4% w/v |
| Sodium m-nitrobenzenesulfonate | 0.8% w/v |
| Prepared and tested in the same manner as Example 1. | |
| Etch.rate: 2.0 μm/min | |
| Appearance of plates: Brown | |
| Example 5 | |
| Hydrogen peroxide | 1.8% w/v |
| Concentrated sulfuric acid | 7.5% w/v |
| Benzotriazole | 0.8% w/v |
| Sodium m-nitrobenzenesulfonate | 0.8% w/v |

Prepared and tested in the same manner as Example 1.
Etch rate: 2.0 μm/min
Appearance of plates: Brown

EXAMPLES 6 and 7

Satisfactory results were also achieved using benzene-1,3-disulfonic acid and naphthalene-1,3,8-trisulfonic acid, trisodium salt in place of the sodium m-nitrobenzenesulfonate of Example 1.

EXAMPLE 8

Satisfactory results were also achieved using tolyltriazole in place of the benzotriazole of Example 1.

Although the invention has been described in terms of specified embodiments which are set forth in considerable detail, it should be understood that this is by way of illustration only and that the invention is not necessarily limited thereto, since alternative embodiments and operating techniques will become apparent to those skilled in the art in view of the disclosure. Accordingly, modifications are contemplated which can be made without departing from the spirit of the described invention.

I claim:

1. A composition useful for the surface treatment of copper, said composition comprising 0.5 to 5% w/v hydrogen peroxide and 0.01 to 5% w/v of an aromatic sulfonic acid or a salt thereof.

2. A composition according to claim 1, which is an aqueous solution.

3. A composition according to claim 1, wherein the sulfonic acid or salt thereof includes one or more aromatic groups which are carbocyclic rings.

4. A composition according to claim 1, wherein the sulfonic acid or salt thereof includes one or more aromatic groups which are substituted by one or more substituents selected from the group consisting of nitro, hydroxy, halogen, lower ($C_{1-6}$) alkyl and lower ($C_{1-6}$) alkoxy.

5. A composition according to claim 1, wherein the sulfonic acid or salt thereof includes an aromatic group which carries one sulfonic acid group.

6. A composition according to claim 1, wherein the sulfonic acid is present as a salt.

7. A composition according to claim 6, wherein the salt is an alkali metal salt.

8. A composition according to claim 6, wherein the salt is a sodium salt.

9. A composition according to claim 1, wherein the sulfonic acid or salt thereof is m-nitrobenzene sulfonic acid or a salt thereof.

10. A composition according to claim 1, wherein the sulfonic acid or salt thereof is sodium m-nitrobenzene sulfonate.

11. A composition according to claim 1, wherein the sulfonic acid or salt thereof is present at a concentration of between 0.01% w/v and 2% w/v.

12. A composition according to claim 1, wherein the hydrogen peroxide is present in the composition at a concentration in the range 0.5 to 3.5% w/v.

13. A composition according to claim 1, wherein the composition includes 2 to 20% w/v of an inorganic acid.

14. A composition as claimed in claim 13, wherein the inorganic acid is sulfuric acid.

15. A composition as claimed in claim 13, wherein the inorganic acid is present in the composition at a concentration of between 5 and 10% w/v.

16. A composition according to claim 1, wherein the composition also includes 0.1 to 2% w/v of a corrosion inhibitor.

17. A composition according to claim 16, wherein the corrosion inhibitor is selected from the group consisting of triazoles, tetrazoles, imidazoles, and mixtures thereof.

18. A composition according to claim 16, wherein the corrosion inhibitor is benzotriazole.

19. A composition according to claim 16, wherein the corrosion inhibitor is present at a concentration of 0.1 to 2% w/v.

20. A composition according to claim 1, wherein the composition consists of 0.5 to 5% w/v hydrogen peroxide, 2 to 20% w/v of an inorganic acid, 0.1 to 2% w/v of a corrosion inhibitor and 0.01 to 5% w/v of the sulfonic acid or salt thereof in aqueous solution.

21. A composition according to claim 20, wherein the inorganic acid is sulfuric acid, the corrosion inhibitor is benzotriazole and the aromatic sulfonic acid or salt thereof is sodium m-nitrobenzenesulfonate.

* * * * *